US010727336B2

(12) United States Patent
Ramaswamy et al.

(10) Patent No.: US 10,727,336 B2
(45) Date of Patent: *Jul. 28, 2020

(54) FERROELECTRIC FIELD EFFECT TRANSISTORS, PLURALITIES OF FERROELECTRIC FIELD EFFECT TRANSISTORS ARRAYED IN ROW LINES AND COLUMN LINES, AND METHODS OF FORMING A PLURALITY OF FERROELECTRIC FIELD EFFECT TRANSISTORS

(71) Applicant: Micron Technology, Inc., Boise, ID (US)

(72) Inventors: Durai Vishak Nirmal Ramaswamy, Boise, ID (US); Kirk D. Prall, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/106,626

(22) Filed: Aug. 21, 2018

(65) Prior Publication Data
US 2018/0358472 A1 Dec. 13, 2018

Related U.S. Application Data

(60) Continuation of application No. 15/677,252, filed on Aug. 15, 2017, now Pat. No. 10,084,084, which is a (Continued)

(51) Int. Cl.
H01L 29/78 (2006.01)
H01L 27/1159 (2017.01)
(Continued)

(52) U.S. Cl.
CPC ...... H01L 29/78391 (2014.09); H01L 27/085 (2013.01); H01L 27/1159 (2013.01);
(Continued)

(58) Field of Classification Search
CPC .......... H01L 29/78391; H01L 29/6684; H01L 27/1159; H01L 27/085;
(Continued)

(56) References Cited

U.S. PATENT DOCUMENTS 4,070,653 A 1/1978 Rao et al.
5,828,092 A 10/1998 Tempel
(Continued)

FOREIGN PATENT DOCUMENTS

CN 101483193 7/2009
CN 102263122 11/2011
(Continued)

OTHER PUBLICATIONS

Nigo et al., "Conduction Band Caused by Oxygen Vacancies in Aluminum Oxide for Resistance Random Access Memory", Journal of Applied Physics vol. 112, 2012, United States, 6 pages.
(Continued)

Primary Examiner — Nelson Garces
(74) Attorney, Agent, or Firm — Wells St. John P.S.

(57) ABSTRACT

A ferroelectric field effect transistor comprises a semiconductive channel comprising opposing sidewalls and an elevationally outermost top. A source/drain region is at opposite ends of the channel. A gate construction of the transistor comprises inner dielectric extending along the channel top and laterally along the channel sidewalk. Inner conductive material is elevationally and laterally outward of the inner dielectric and extends along the channel top and laterally along the channel sidewalk. Outer ferroelectric material is elevationally outward of the inner conductive
(Continued)

material and extends along the channel top. Outer conductive material is elevationally outward of the outer ferroelectric material and extends along the channel. Other constructions and methods are disclosed.

13 Claims, 7 Drawing Sheets

Related U.S. Application Data division of application No. 15/005,250, filed on Jan. 25, 2016, now Pat. No. 9,761,715, which is a division of application No. 14/260,977, filed on Apr. 24, 2014, now Pat. No. 9,263,577.

(51) Int. Cl.
H01L 27/085 (2006.01)
H01L 29/66 (2006.01)

(52) U.S. Cl.
CPC .... H01L 29/6684 (2013.01); H01L 29/66795 (2013.01); H01L 29/785 (2013.01)

(58) Field of Classification Search
CPC ........ H01L 27/11585–11597; H01L 21/28291; H01L 29/516; H01L 21/823821; H01L 27/0924; H01L 21/823431; H01L 29/66795–66818; H01L 29/41791; H01L 27/1211; H01L 27/10879; H01L 27/10826; H01L 27/0886; H01L 21/845; H01L 29/785–7856; H01L 2029/7857–7858; H01L 2924/13067; H01L 29/66825; H01L 29/788–7889; H01L 27/11502–11514; H01L 2924/1441; H01L 28/40–92; G11C 11/22–2297; G11C 11/5657; G11C 14/0027; G11C 14/0072

See application file for complete search history.

(56) References Cited

U.S. PATENT DOCUMENTS

| | | | |
|---|---|---|---|
| 6,144,060 A | 11/2000 | Park et al. | |
| 6,249,014 B1 | 6/2001 | Bailey | |
| 6,337,496 B2 | 1/2002 | Jung | |
| 6,611,014 B1 | 8/2003 | Kanaya et al. | |
| 6,635,528 B2 | 10/2003 | Gilbert et al. | |
| 6,674,109 B1 | 1/2004 | Fujimori et al. | |
| 6,876,021 B2 | 4/2005 | Martin et al. | |
| 6,940,085 B2 | 9/2005 | Fricke et al. | |
| 7,001,821 B2 | 2/2006 | Aggarwal et al. | |
| 7,304,339 B2 | 12/2007 | Chen | |
| 7,408,212 B1 | 8/2008 | Luan et al. | |
| 7,558,097 B2 | 7/2009 | Khellah et al. | |
| 7,902,594 B2 | 3/2011 | Mizuki | |
| 8,193,522 B2 | 6/2012 | Li | |
| 8,212,256 B2 | 7/2012 | Chen et al. | |
| 8,217,443 B2 | 7/2012 | Izumi | |
| 8,969,170 B2 | 3/2015 | Liebau et al. | |
| 9,559,118 B2 | 1/2017 | Karda et al. | |
| 9,761,715 B2* | 9/2017 | Ramaswamy | H01L 27/1159 |
| 10,163,917 B2 | 12/2018 | Ramaswamy | |
| 10,396,145 B2 | 8/2019 | Balakrishnan et al. | |
| 2001/0040249 A1 | 11/2001 | Jung | |
| 2001/0044205 A1 | 11/2001 | Gilbert et al. | |
| 2002/0036313 A1 | 3/2002 | Yang et al. | |
| 2002/0102808 A1 | 8/2002 | Pu et al. | |
| 2002/0119621 A1 | 8/2002 | Lin | |
| 2002/0125536 A1* | 9/2002 | Iwasa | H01L 21/823425 257/368 |
| 2003/0183867 A1 | 10/2003 | Fricke et al. | |
| 2004/0099893 A1 | 5/2004 | Martin et al. | |
| 2004/0114428 A1 | 6/2004 | Morikawa | |
| 2004/0129961 A1 | 7/2004 | Paz De Araujo et al. | |
| 2004/0228172 A1 | 11/2004 | Rinerson et al. | |
| 2005/0051822 A1 | 3/2005 | Manning | |
| 2005/0101034 A1 | 5/2005 | Aggarwal et al. | |
| 2005/0167787 A1 | 8/2005 | Fricke et al. | |
| 2006/0030110 A1 | 2/2006 | Kumura et al. | |
| 2006/0151771 A1 | 7/2006 | Asano et al. | |
| 2006/0181918 A1 | 8/2006 | Shin et al. | |
| 2006/0284228 A1 | 12/2006 | Lee et al. | |
| 2008/0266949 A1* | 10/2008 | He | H01L 27/115 365/185.05 |
| 2008/0273363 A1 | 11/2008 | Mouli | |
| 2009/0016094 A1 | 1/2009 | Rinerson et al. | |
| 2009/0026424 A1 | 1/2009 | Malhotra et al. | |
| 2009/0078979 A1 | 3/2009 | Kumura et al. | |
| 2009/0153056 A1 | 6/2009 | Chen et al. | |
| 2010/0129938 A1 | 5/2010 | Kumura et al. | |
| 2010/0140589 A1 | 6/2010 | Ionescu | |
| 2011/0080767 A1 | 4/2011 | Rinerson et al. | |
| 2011/0147888 A1 | 6/2011 | Steigerwald et al. | |
| 2011/0188281 A1 | 8/2011 | Siau et al. | |
| 2012/0051137 A1 | 3/2012 | Hung et al. | |
| 2013/0009125 A1 | 1/2013 | Park et al. | |
| 2013/0214242 A1 | 8/2013 | Sandhu | |
| 2014/0095853 A1* | 4/2014 | Sarangshar | G06F 9/4401 713/1 |
| 2014/0138753 A1 | 5/2014 | Ramaswamy et al. | |
| 2014/0254276 A1* | 9/2014 | Tokuhira | G11C 11/22 365/185.17 |
| 2014/0332750 A1 | 11/2014 | Ramaswamy et al. | |
| 2014/0346428 A1 | 11/2014 | Sills et al. | |
| 2015/0028280 A1 | 1/2015 | Sciarrillo et al. | |
| 2015/0029775 A1 | 1/2015 | Ravasio et al. | |
| 2015/0054063 A1 | 2/2015 | Karda et al. | |
| 2015/0249113 A1 | 9/2015 | Takagi et al. | |
| 2015/0349255 A1 | 12/2015 | Pellizzer et al. | |
| 2015/0357380 A1 | 12/2015 | Pellizzer | |
| 2015/0380641 A1 | 12/2015 | Ino et al. | |
| 2016/0005961 A1 | 1/2016 | Ino | |
| 2016/0020389 A1 | 1/2016 | Ratnam et al. | |
| 2016/0240545 A1 | 8/2016 | Karda et al. | |
| 2017/0186812 A1 | 6/2017 | Lee et al. | |
| 2018/0269216 A1 | 9/2018 | Lee | |
| 2019/0189357 A1 | 6/2019 | Chavan et al. | |

FOREIGN PATENT DOCUMENTS

| | | |
|---|---|---|
| CN | 104051231 | 9/2014 |
| CN | 201580021286.4 | 1/2019 |
| CN | 201680050058.4 | 10/2019 |
| JP | 2009-283763 | 12/2009 |
| KR | 10-0799129 | 1/2008 |
| KR | 10-2008-0092812 | 10/2008 |
| WO | WO 2008/126961 | 10/2008 |

OTHER PUBLICATIONS

Calderoni et al., U.S. Appl. No. 16/255,563, filed Jan. 23, 2019, titled "Methods of Incorporating Leaker-Devices into Capacitor Configurations to Reduce Cell Disturb, and Capacitor Configurations Incorporating Leaker-Devices", 47 pages.

Mutch et al., U.S. Appl. No. 16/507,826, filed Jul. 10, 2019, titled "Memory Cells and Methods of Forming a Capacitor Including Current Leakage Paths Having Different Total Resistances", 43 pages.

Junlabhut et al., "Optical Absorptivity Enhancement of SiO2 Thin Film by Ti and Ag Additive", Energy Procedia vol. 34, Dec. 2013, United Kingdom, pp. 734-739.

Katiyar et al., "Electrical Properties of Amorphous Aluminum Oxide Thin Films", Acta Materialia vol. 55, Dec. 2005, Netherlands, pp. 2617-1622.

Li et al., "Low-Temperature Magnetron Sputter-Deposition, Hardness, and Electrical Resisitivity of Amorphous and Crystalline Alumina Thin Films", Journal of Vacuum Science & Technology A vol. 18, No. 5, Sep.-Oct. 2000, United States, pp. 2333-2338

(56) References Cited

OTHER PUBLICATIONS

Lv et al., "Transition Metal Dichalcogenides and Beyond: Synthesis, Properties, and Applications of Single- and Few-layer Nanosheets", American Chemical Society of Chemical Research vol. 48, Dec. 9, 2014, United States, pp. 56-64.
Podgornyi et al., "Leakage Currents in Thin Ferroelectric Films", Physics of the Solid Waste vol. 54, No. 5, Dec. 2012, Germany, pp. 911-914.
Schroeder et al., "Hafnium Oxide based CMOS Compatible Ferroelectric Materials", ECS Journal of Solid State Science and Technology vol. 2(4), Jan. 28, 2013, United States, pp. N69-N72.

\* cited by examiner

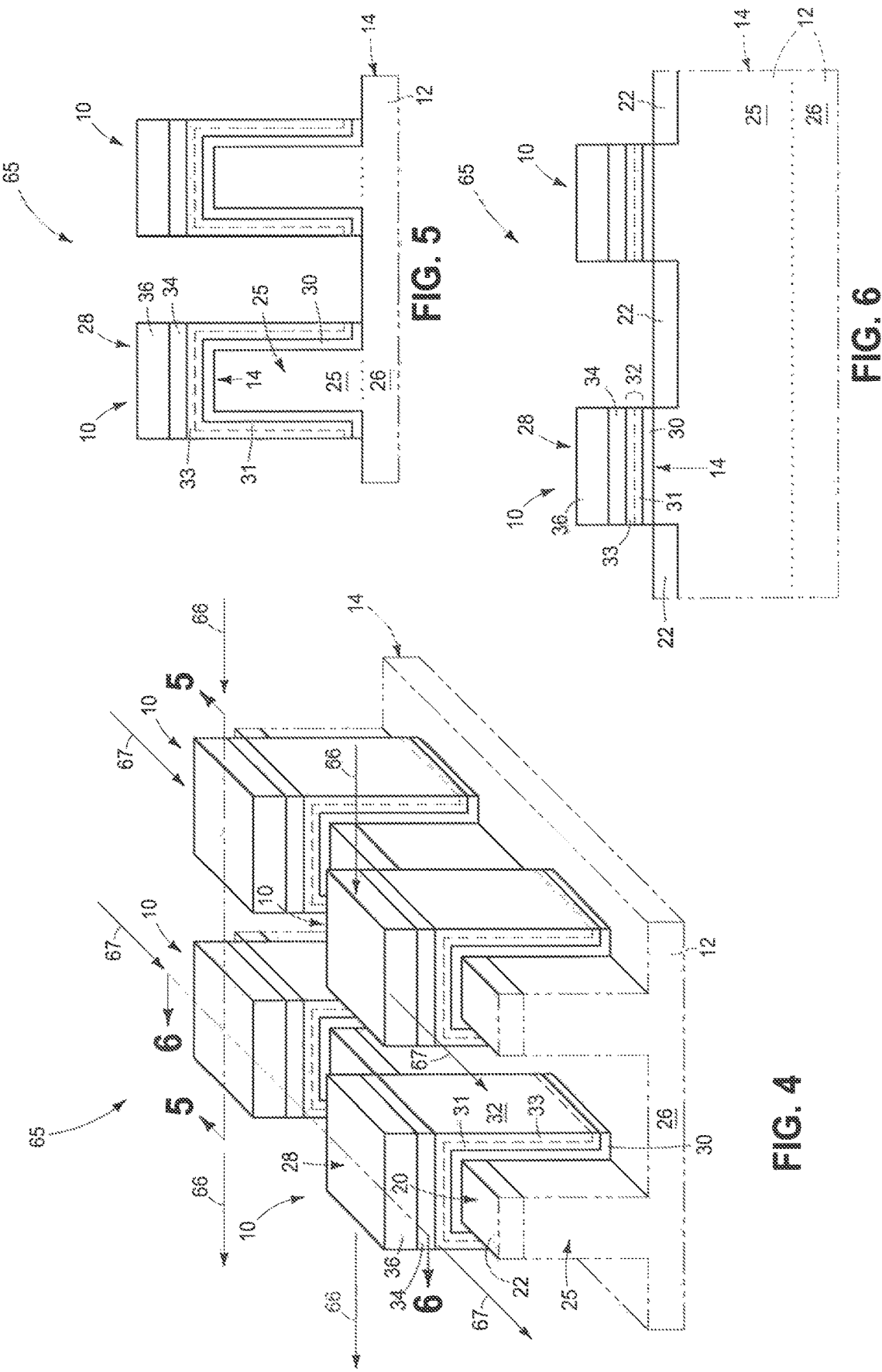

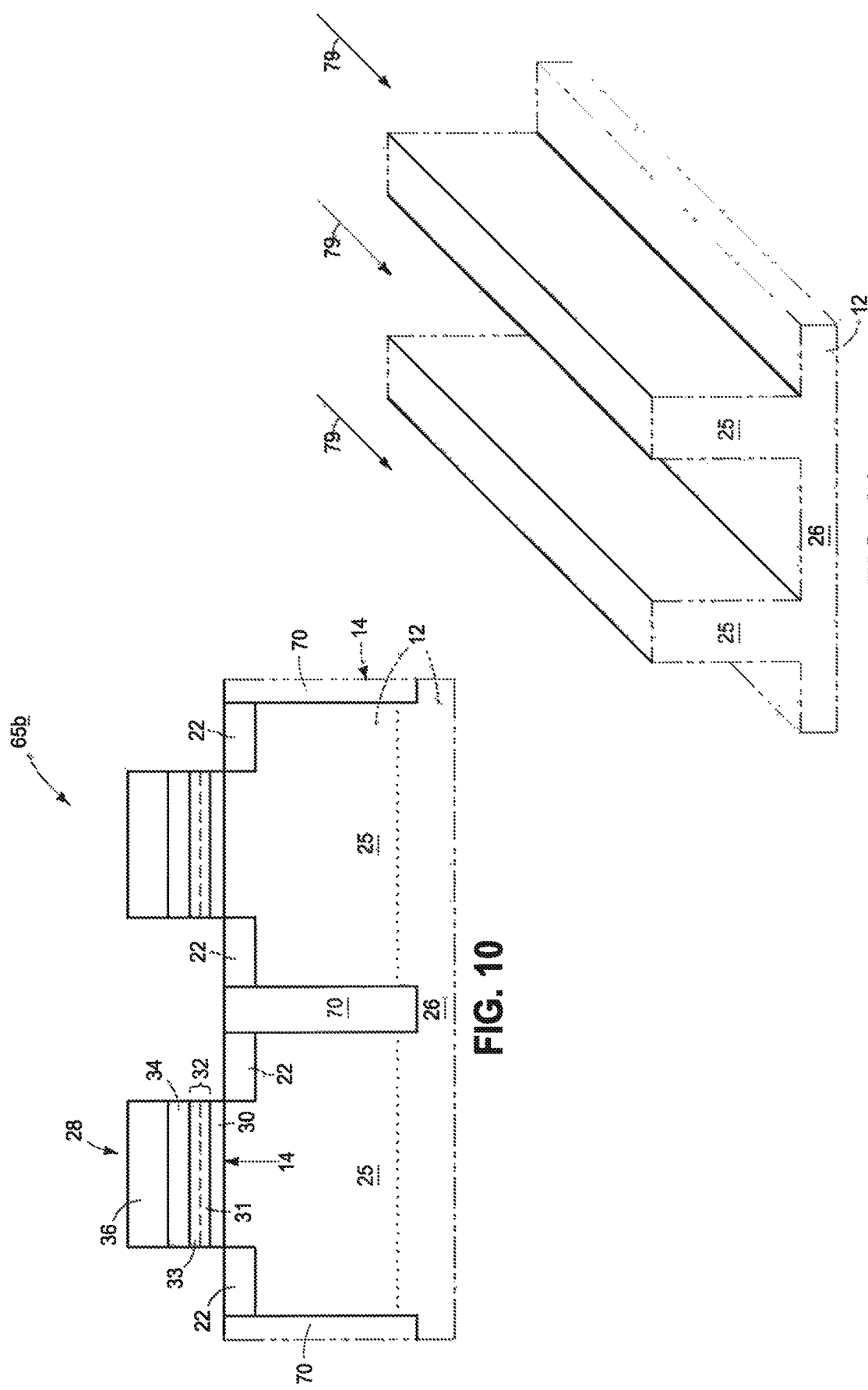

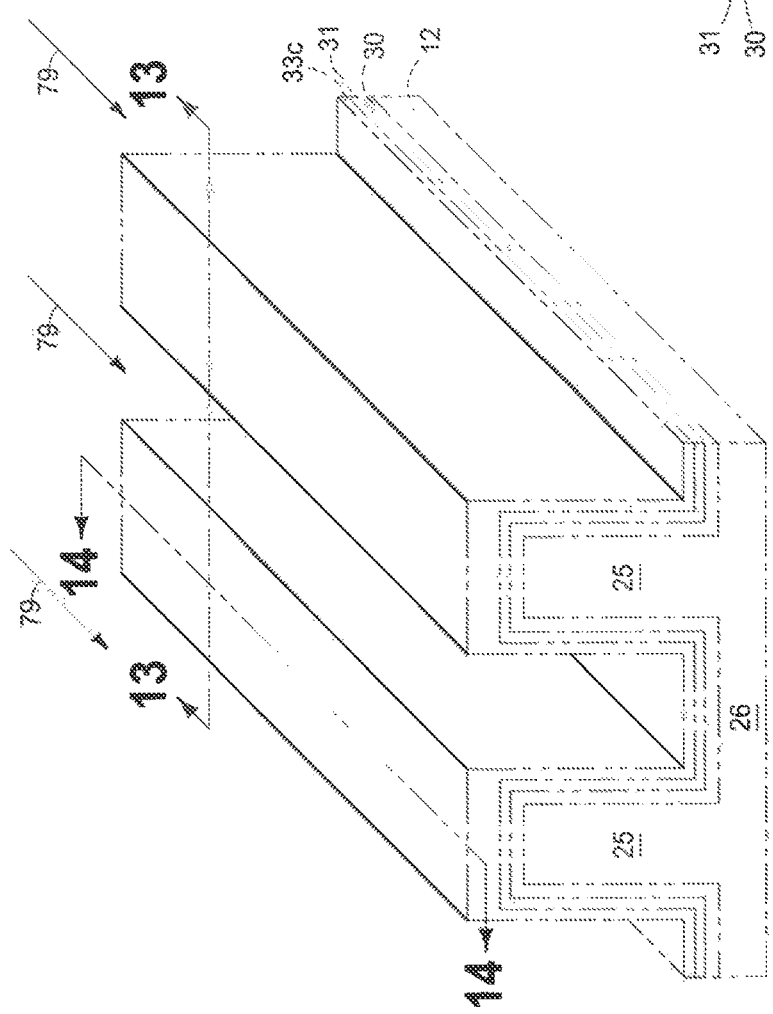
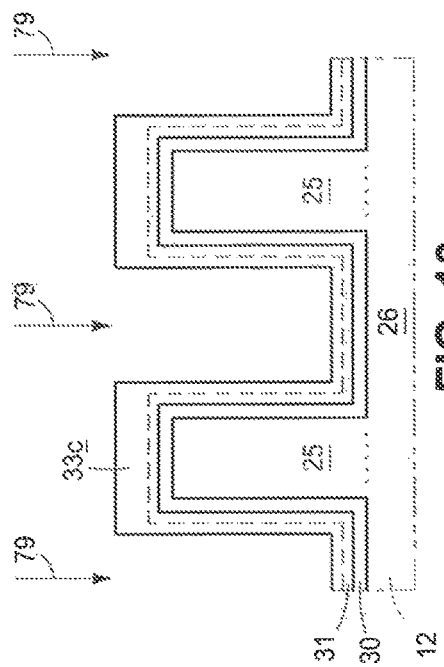
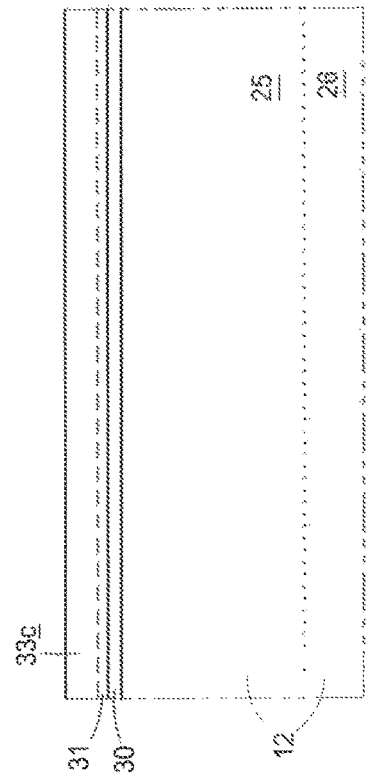
FIG. 12
FIG. 13
FIG. 14

FERROELECTRIC FIELD EFFECT TRANSISTORS, PLURALITIES OF FERROELECTRIC FIELD EFFECT TRANSISTORS ARRAYED IN ROW LINES AND COLUMN LINES, AND METHODS OF FORMING A PLURALITY OF FERROELECTRIC FIELD EFFECT TRANSISTORS

RELATED PATENT DATA

This patent resulted from a continuation application of U.S. patent application Ser. No. 15/677,252, filed Aug. 15, 2017, entitled "Ferroelectric Field Effect Transistors, Pluralities Of Ferroelectric Field Effect Transistors Arrayed In Row Lines And Column Lines, And Methods Of Forming A Plurality Of Ferroelectric Field Effect Transistors", naming Durai Vishak Nirmal Ramaswamy and Kirk D. Prall as inventors, which was a divisional application of U.S. patent application Ser. No. 15/005,250, filed Jan. 25, 2016, entitled "Ferroelectric Field Effect Transistors, Pluralities Of Ferroelectric Field Effect Transistors Arrayed In Row Lines And Column Lines, And Methods Of Forming A Plurality Of Ferroelectric Field Effect Transistors", naming Durai Vishak Nirmal Ramaswamy and Kirk D. Prall as inventors, now U.S. Pat. No. 9,761,715, which was a divisional of U.S. patent application Ser. No. 14/260,977, filed Apr. 24, 2014, entitled "Ferroelectric Field Effect Transistors, Pluralities Of Ferroelectric Field Effect Transistors Arrayed In Row Lines And Column Lines, And Methods Of Forming A Plurality Of Ferroelectric Field Effect Transistors", naming Durai Vishak Nirmal Ramaswamy and Kirk D. Prall as inventors, now U.S. Pat. No. 9,263,577, the disclosures of which are incorporated by reference.

TECHNICAL FIELD

Embodiments disclosed herein pertain to ferroelectric field effect transistors, to pluralities of ferroelectric field effect transistors arrayed in row lines and column lines, and to methods of forming a plurality of ferroelectric field effect transistors.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bit lines, data lines, sense lines, or data/sense lines) and access lines (which may also be referred to as word lines). The digit lines may conductively interconnect memory cells along columns of the array, and the access lines may conductively interconnect memory cells along rows of the array. Each memory cell may be uniquely addressed through the combination of a digit line and an access line.

Memory cells may be volatile or non-volatile. Non-volatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

A field effect transistor is one type of electronic component that may be used in a memory cell. These transistors comprise a pair of conductive source/drain regions having a semiconductive channel region there-between. A conductive gate is adjacent the channel region and separated there-from by a thin gate insulator. Application of a suitable voltage to the gate allows current to flow from one of the source/drain regions to the other through the channel region. When the voltage is removed from the gate, current is largely prevented from flowing through the channel region. Field-effect transistors may also include additional structure, for example reversibly programmable charge storage regions as part of the gate construction. Transistors other than field-effect transistors, for example bipolar transistors, may additionally or alternately be used in memory cells. Transistors may be used in many types of memory. Further, transistors may be used and formed in arrays other than memory.

One type of transistor is a ferroelectric field effect transistor (FeFET) wherein at least some portion of the gate construction comprises ferroelectric material. Such materials are characterized by two stable polarized states. These different states in field effect transistors may be characterized by different threshold voltage ($V_t$) for the transistor or by different channel conductivity for a selected operating voltage. Polarization state of the ferroelectric material can be changed by application of suitable programming voltages, and which results in one of high channel conductance or low channel conductance. The high and low conductance, invoked by the ferroelectric polarization state, remains after removal of the programming gate voltage (at least for a time). The status of the channel can be read by applying a small drain voltage which does not disturb the ferroelectric polarization.

BRIEF DESCRIPTION OF THE DRAWINGS

FIG. 4 is a diagrammatic perspective view of a portion of a substrate fragment comprising an array of ferroelectric field effect transistor constructions in accordance with an embodiment of the invention.

FIG. 5 is a section view taken through line 5-5 in FIG. 4.

FIG. 6 is a section view taken through line 6-6 in FIG. 4.

FIG. 10 is a diagrammatic section view of a portion of a substrate fragment comprising an array of ferroelectric field effect transistor constructions in accordance with an embodiment of the invention.

FIG. 11 is a diagrammatic perspective view of a portion of a substrate fragment in process in accordance with an embodiment of the invention.

FIG. 12 is a view of the FIG. 11 substrate at a processing step subsequent to that shown by FIG. 11.

FIG. 13 is a section view taken through line 13-13 in FIG. 12.

FIG. 14 is a section view taken through line 14-14 in FIG. 12.

DETAILED DESCRIPTION OF EXAMPLE EMBODIMENTS

A ferroelectric field effect transistor 10 in accordance with an embodiment of the invention is initially described with reference to FIGS. 1-3. Example transistor 10 is shown as having been fabricated relative to an underlying substrate 14, which may include semiconductive material 12 of a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). One example is semiconductor-on-insulator. The term "substrate" refers to any supporting structure, including, but not limited to, the semiconductive substrates described above.

Any of the materials and/or structures described herein may be homogenous or non-homogenous, and regardless may be continuous or discontinuous over any material that such overlie. As used herein, "different composition" only requires those portions of two stated materials that may be directly against one another to be chemically and/or physically different, for example if such materials are not homogenous. If the two stated materials are not directly against one another, "different composition" only requires that those portions of the two stated materials that are closest to one another be chemically and/or physically different if such materials are not homogenous. In this document, a material or structure is "directly against" another when there is at least some physical touching contact of the stated materials or structures relative one another. In contrast, "over", "on", and "against" not preceded by "directly", encompass "directly against" as well as construction where intervening material(s) or structure(s) result(s) in no physical touching contact of the stated materials or structures relative one another. Further, unless otherwise stated, each material may be formed using any suitable existing or yet-to-be-developed technique, with atomic layer deposition, chemical vapor deposition, physical vapor deposition, epitaxial (growth, diffusion doping, and ion implanting being examples.

Example material 12 includes appropriately p-type and/or n-type doped monocrystalline or polycrystalline silicon. FIGS. 1-3 depict transistor 10 in the absence of surrounding materials and circuitry for clarity. Other components of integrated circuitry may be elevationally outward, elevationally inward, and/or to the sides of transistor 10. Additionally, multiple such transistors would likely constitute part of integrated circuitry, for example an array of such transistors that might be used in memory circuitry, logic circuitry, or other circuitry.

Figure 2:
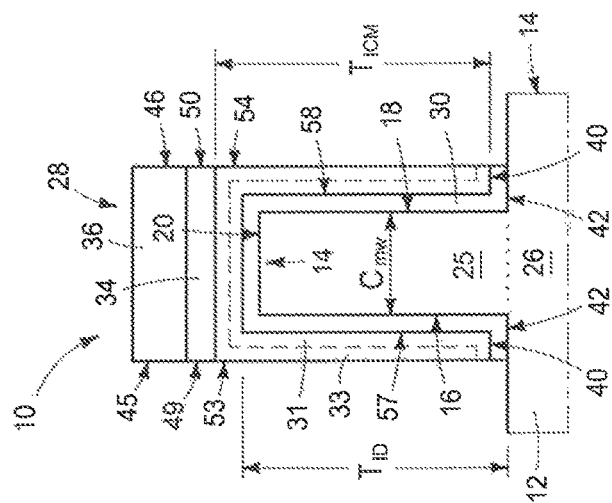
FIG. 2 is a section view taken through line 2-2 in FIG. 1.
Figure 3:
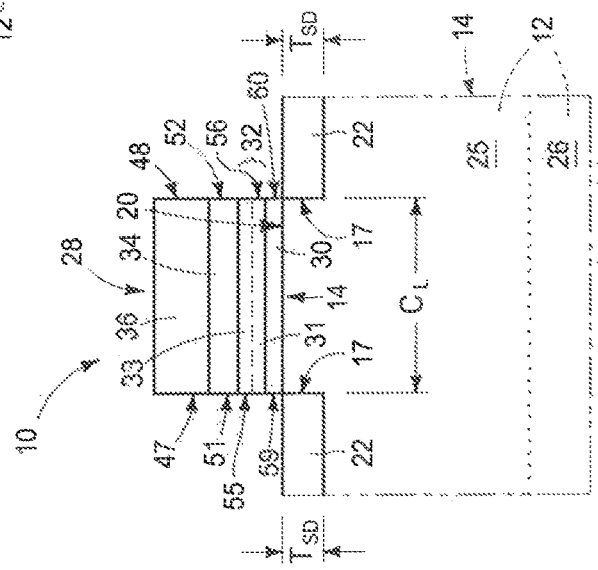
FIG. 3 is a section view taken through line 3-3 in FIG. 1.

Ferroelectric transistor 10 comprises a semiconductive channel 14 (FIGS. 2 and 3) that has opposing sidewalls 16, 18 (FIG. 2), opposite ends 17 (FIG. 3), and an elevationally outermost top 20 (FIGS. 2 and 3). A source/drain region 22 (FIGS. 1 and 3) is at opposite ends 17 of channel 14. Example ferroelectric transistor 10 may be p-type or n-type, and lightly doped drain regions, halo regions, etc. (not shown) may be used. Regardless, transistor 10 is shown in part as having been fabricated relative to a rail or fin 25 that extends elevationally from a base 26, each of which comprises semiconductive material 12. An example elevational projecting distance of rail 25 relative to an devotionally outermost surface of base 26 is about 200 to 2,000 Angstroms. An example maximum elevational thickness $T_{SD}$ for source/drain regions 22 is about 100 to 1,000 Angstroms. Regardless, FIGS. 1-3 show source/drain regions 22 only being in elevationally outmost portions of rail 25. Alternately, as examples, the source/drain regions may project deeper into rails 25, including completely devotionally there-into or there-through. Further, the source/drain regions may comprise elevated source/drain material.

Ferroelectric transistor 10 includes a gate construction 28 comprising various materials. Example gate construction 28 includes inner dielectric 30 extending along channel top 20 and laterally along channel sidewalk 16, 18. Example inner dielectric materials 30 include one or both of silicon dioxide and silicon nitride. An example thickness for dielectric 30 is about 10 to 100 Angstroms. In this document, "thickness" by itself (no preceding directional adjective) is defined as the mean straight-line distance through a given material or region perpendicularly from a closest surface of an immediately adjacent material of different composition or of an immediately adjacent region. Additionally, the various materials described herein may be of substantially constant thickness or of variable thicknesses.

Inner conductive (i.e. electrically) material 32 (designated in FIGS. 1 and 3) is elevationally and laterally outward of inner dielectric 30 and extends along channel top 20 and laterally along channel sidewalls 16, 18. Example inner conductive materials 32 include any suitable one or more of elemental metals, alloys of two or more elemental metals, conductive metal compounds, and conductively doped semiconductive material. Example construction 28 shows inner conductive material 32 as comprising materials 31 and 33. In one example, each may be of the same chemical composition, for example. TiN formed using two different deposition techniques as described below in connection with a method embodiment of the invention.

Outer ferroelectric material 34 is elevationally outward of inner conductive material 32 and extends along channel top 20. Any suitable existing or yet-to-be-developed ferroelectric material may be used. Examples include ferroelectrics that have one or more of transition metal oxide, zirconium, zirconium oxide, hafnium, hafnium oxide, lead zirconium titanate, and barium strontium titanate, and may have dopant therein which comprises one or more of silicon, aluminum, lanthanum, yttrium, erbium, calcium, magnesium, strontium, and a rare earth element. Two specific examples are $Hf_xSi_yO_z$ and $Hf_xZr_yO_z$. An example thickness for outer ferroelectric material 34 is about 10 to 100 Angstroms.

Outer conductive material 36 is elevationally outward of outer ferroelectric material 34 and extends along channel top 20. Example materials include any of those described above with respect to inner conductive material 32, with one example being a composite of elemental tungsten and TiN. An example thickness for material 32 is about 100 to 1,000 Angstroms. Example gate construction 28 may be considered by people of skill in the art as MFMIS construction.

In one embodiment, no portion of outer ferroelectric material 34 is laterally over any of channel sidewalls 16, 18, for example as is shown. In one embodiment, no portion of outer conductive material 36 is laterally over any of channel sidewalls 16, 18, for example as shown. In one embodiment, each source/drain region 22 has a maximum elevational thickness $T_{SD}$ (FIGS. 1 and 3) that is less than a maximum elevational thickness $T_{ID}$ of inner dielectric 30 (FIG. 2). In one embodiment, each source/drain region 22 has a maximum elevational thickness $T_{SD}$ that is less than a maximum elevational thickness $T_{ICM}$ of inner conductive material 32 (FIG. 2). In one embodiment, inner conductive material 32 has a maximum elevational thickness $T_{ICM}$ that is greater than a minimum width $C_{MW}$ of channel 14 taken orthogonally relative to a shortest straight-line distance $C_L$ (i.e., channel length) between source/drain regions 22 (e.g., $C_{MW}$ being shown in FIG. 2 and $C_L$ being shown in FIG. 3). $C_L$ is shown as being greater than $C_{MW}$, although this could be reversed or $C_L$ and $C_{MW}$ could be equal. In one embodiment, inner conductive material 32 has a maximum elevational thickness $T_{ICM}$ that is greater than channel length $C_L$. In one embodiment, inner conductive material 32 and inner dielectric 30 have respective elevationally innermost surfaces 40, 42 (FIG. 2), respectively, that are not elevationally coincident.

Field effect transistor 10 is shown as being horizontally oriented, although vertical orientation or orientations other than vertical or horizontal may be used. In this document, vertical is a direction generally orthogonal to horizontal, with horizontal referring to a general direction along a primary surface relative to which a substrate is processed during fabrication. Further, vertical and horizontal as used herein are generally perpendicular directions relative one another independent of orientation of the substrate in three dimensional space. Additionally, elevational, above, and below are with reference to the vertical direction. Further in the context of this document, a vertically oriented transistor is characterized by predominant current flow through the channel in the vertical direction. A horizontally oriented transistor is characterized by predominant current flow through the channel in the horizontal direction.

Figure 1:
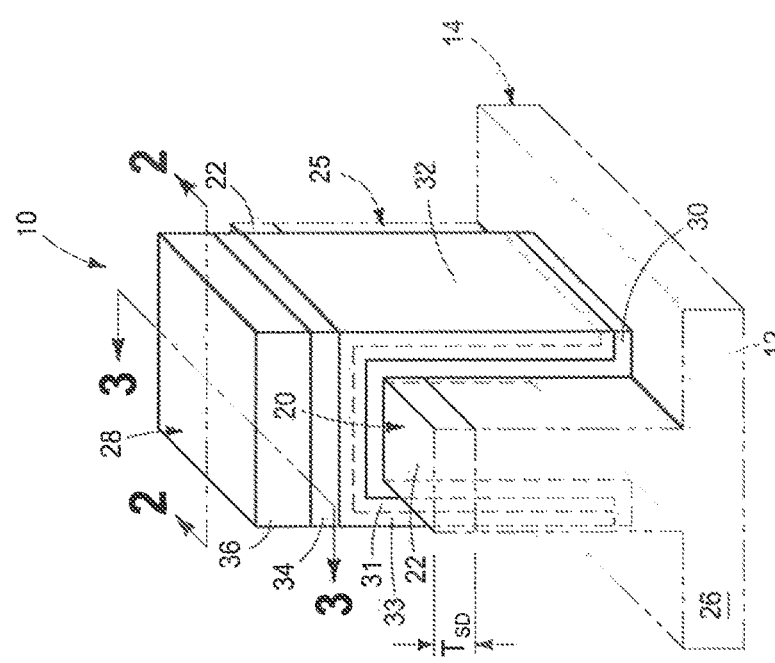
FIG. 1 is a diagrammatic perspective view of a portion of a substrate fragment comprising a ferroelectric field effect transistor construction in accordance with an embodiment of the invention.

In the example embodiments of FIGS. 1-3, each of outer conductive material 36, outer ferroelectric material. 34, inner conductive material 32, and inner dielectric 30 elevationally outward of channel 14 are four-sided and shown as having vertical sidewalls (i.e., within 5° of vertical). Other than vertical and/or four-sided structuring may be used, for example more or less than four sides and/or with one or more sides being curved or having a combination of straight and curved segments. Example gate construction 28 in FIGS. 2 and 3 is shown as comprising outer conductive material 36 having four vertical sidewalls 45-48, outer ferroelectric material 34 having four vertical sidewalls 49-52, inner conductive material 32 having four vertical sidewalls 53-56, and inner dielectric 30 having four vertical sidewalls 57-60. In one embodiment, all of the outer conductive material, the outer ferroelectric material, the inner conductive material, and the inner dielectric have at least two laterally opposing vertical sidewalls elevationally outward of the channel that are laterally coincident relative one another. For example as shown in FIG. 3, sidewalls 47, 51, 55, and 59 are laterally coincident relative one another, and as shown in FIG. 2 sidewalls 48, 52, 56, and 60 are laterally coincident relative one another.

In one embodiment, all of the outer conductive material, the outer ferroelectric material, and the inner semiconductive material have at least two pairs of laterally opposing vertical sidewalls elevationally outward of the channel that are laterally coincident relative one another, for example as is shown with respect to gate construction 28 in FIGS. 1-3. Specifically, FIG. 3 illustrates a pair of two laterally opposing vertical sidewalls 47, 48 for outer conductive material 36, a pair of two laterally opposing vertical sidewalls 51, 52 for outer ferroelectric material 34, a pair of two laterally opposing vertical sidewalls 55, 56 for inner conductive material 32, and wherein sidewalls 47, 51, 55, and 59 are laterally coincident relative one another as are sidewalls 48, 52, 56, and 60. FIG. 2 illustrates another pair of laterally opposing sidewalls 45, 46 of outer conductive material 36, another pair of laterally opposing vertical sidewalls 49, 50 of outer ferroelectric material 34, and another pair of two laterally opposing vertical sidewalls 53, 54 of inner conductive material 32, with sidewalls 45, 49, and 53 being laterally coincident relative one another and sidewalk 46, 50, and 54 being laterally coincident relative one another.

Each of outer conductive material 36, outer ferroelectric material 34, and inner conductive material 32 in the depicted embodiment may be considered as having respective encircling perimeter edges in at least one respective horizontal cross-section elevationally outward of channel 14 (e.g., respective perimeter edges as defined by their respective sidewalls in at least one, horizontal plane). In some embodiments, any two or all three of such encircling perimeter edges are everywhere laterally coincident, with all three encircling perimeter being shown as being laterally coincident in example gate construction 28 in FIGS. 1-3.

Some embodiments of the invention include a plurality of ferroelectric field effect transistors arrayed in row lines and column lines, for example an array 65 as shown in FIGS. 4-6. Like numerals from the above-described embodiments have been used where appropriate, with some construction differences being indicated with different numerals. Example array 65 includes a plurality of ferroelectric field effect transistors 10 substantially as shown and described above with reference to FIGS. 1-3. Transistors 10 in array 65 are shown as extending in row lines 66 and column lines 67. Use of "row" and "column" in this document is for convenience in distinguishing one series of lines from another series of lines. Accordingly, "row" and "column" are intended to be synonymous with any series of lines independent of function. Regardless, the rows may be straight and/or curved and/or parallel and/or not parallel relative one another, as may be the columns. Further, the rows and columns may intersect relative one another at 90° or at one or more other angles. In the depicted example, each of the row lines and column lines are shown as being individually straight and angling relative one another at 90°. Dielectric isolating material (not shown) would likely be between and among lines 66, 67 but is not shown for clarity. Only two row lines 66 and two column lines 67 are shown in FIGS. 4-6, as are only two ferroelectric transistors 10 being shown in each line 66 and 67. An array would likely have thousands or more transistors of like construction therein, arrayed in thousands or more column and row lines.

In one embodiment, at least one of the outer conductive material and the outer ferroelectric material is discontinuous along both of the row lines and the column lines between immediately adjacent transistors. FIGS. 4-6 depicts such an example, and additionally wherein both of outer conductive material 36 and outer ferroelectric material 34 are discontinuous along both of row lines 66 and column lines 67 between immediately adjacent transistors (i.e., within such respective lines). Conductive contacts (not shown) can be made to the individual source/drain regions 22, and individual conductive contacts (not shown) can be made to outer conductive material 36 of individual gate constructions 28. Any other attribute(s) or construction(s) as described above may be used.

Figure 8:
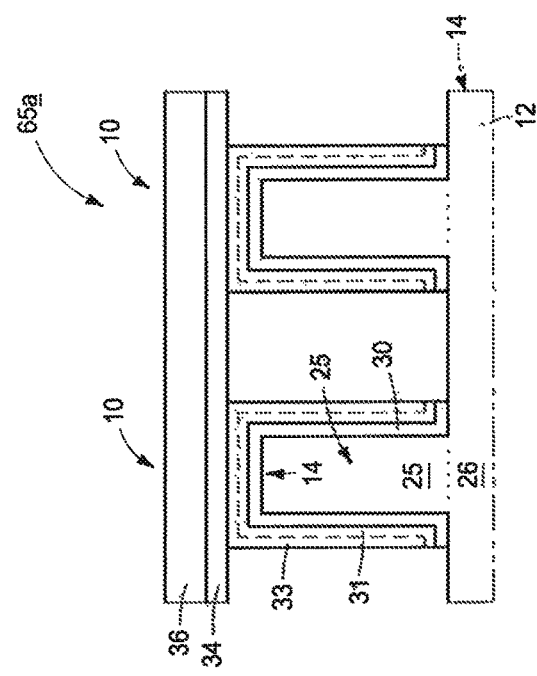
FIG. 8 is a section view taken through line 8-8 in FIG. 7.
Figure 9:
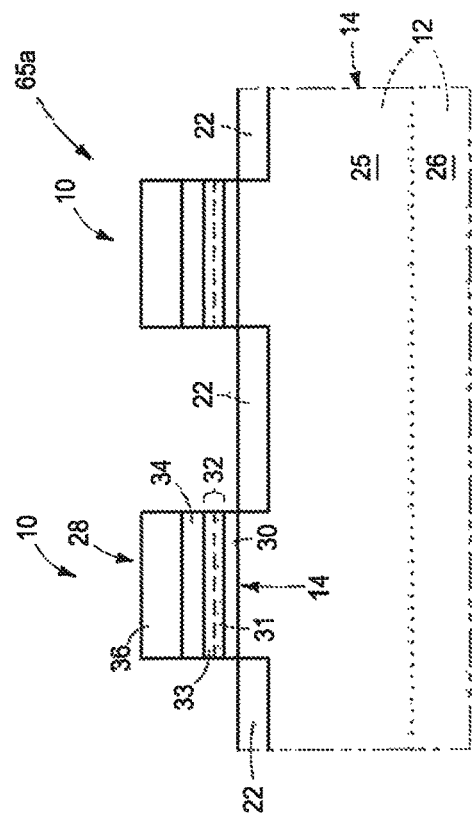
FIG. 9 is a section view taken through line 9-9 in FIG. 7.
Figure 7:
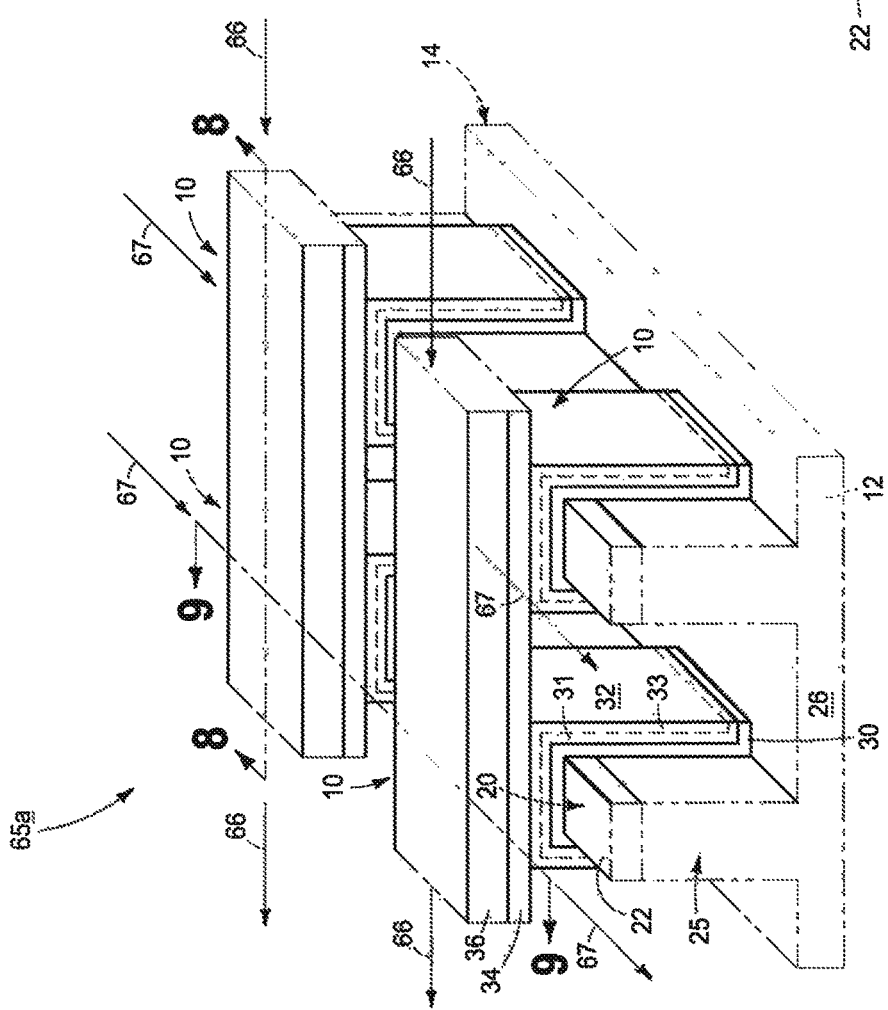
FIG. 7 is a diagrammatic perspective view of a portion of a substrate fragment comprising an array of ferroelectric field effect transistor constructions in accordance with an embodiment of the invention.

In one embodiment, the outer conductive material and the outer ferroelectric material are discontinuous between immediately adjacent transistors along one of the collective row lines and the collective column lines. The conductive material and the outer ferroelectric material are continuous between immediately adjacent transistors along the other of the collective row lines and the column lines. An alternate such example is shown in FIGS. 7-9 with respect to an array 65a of a plurality of ferroelectric field effect transistors 10. Like numerals from the above-described embodiments have been used where appropriate, with some construction differences being indicated with the suffix "a" or with different numerals. Discontinuity of outer conductive material 36 and outer ferroelectric material 34 is shown in array 65a as being between immediately adjacent transistors 10 along column lines 67. Outer conductive material 36 and outer ferroelectric material 34 are continuous between immediately adjacent transistors along row lines 66 in the construction of FIGS. 7-9. Of course, the relationship could be reversed (not shown) wherein such materials are continuous along the column lines and discontinuous along the row lines. A chosen array construction like 65 or 65a might likely be dependent upon a particular circuitry architecture being fabricated (e.g., AND vs. NOR). Any other attribute(s) or construction(s) as described above may be used.

The above array embodiments show a single source/drain region 22 being shared between and by two immediately adjacent transistors 10 in a given column 67, and semiconductive material 12 also being continuous along an individual column 67. Alternately, as examples, the semiconductive material along individual columns may be formed to be partially or wholly discontinuous between immediately adjacent transistors, and/or source/drain regions 22 might not be shared by immediately adjacent transistors. One such example embodiment array 65b is shown in FIG. 10 in comparison to the construction(s) as shown by FIGS. 6 and 9. Like numerals from the above-described embodiments have been used where appropriate, with some construction differences being indicated with different numerals or with the suffix "b" or with different numerals. In FIG. 10, dielectric material 70 (e.g., silicon dioxide and/or silicon nitride) may be used to electrically isolate between adjacent components. Dielectric 70 is shown extending through rails 25 and into base 26. Alternately, the dielectric may extend only partially into rails 25 (not shown) or terminate at the interface of rails 25 and base 26 (not shown). Any other attribute(s) or construction(s) as described above may be used.

Ferroelectric field effect transistors and arrays in accordance with the invention may be fabricated using any existing or yet-to-be-developed techniques, including for example those described below.

Embodiments of the invention include methods of forming a plurality of ferroelectric field effect transistors. Example such embodiments are described with reference to FIGS. 11-21. Like numerals from the above-described embodiments have been used where appropriate, with some construction differences being indicated with different numerals or with the suffix "c". Referring to FIG. 11, a plurality of trenches 79 has been formed into semiconductive material 12, thereby forming fins or rails 25. Example trenches 79 are shown as being parallel and longitudinally elongated relative to horizontal.

Referring to FIG. 12-14, inner dielectric 30 has been formed over sidewalls of trenches 79 and over semiconductive material 12 that is between trenches 79. Inner dielectric 30 may also be formed elevationally over the bases of trenches 79 as shown. First inner conductive material 31 has been formed over inner dielectric 30, the trench bases, the trench sidewalls, and semiconductive material 12 that is between trenches 79. FIGS. 12-14 depict an example embodiment wherein first inner conductive material 31 is formed to be both a) continuous between trenches 79 in a direction orthogonal to the horizontal longitudinal running direction of parallel trenches 79, and b) continuous within trenches 79. Example techniques for depositing first inner conductive material include chemical vapor deposition and atomic layer deposition. Additionally, second inner conductive material 33c has been formed over and is electrically coupled to first inner conductive material 31. Second inner conductive material 33c is formed to be elevationally thicker over the semiconductive material that is between the trenches than any that is formed elevationally centrally over the trench bases. In one embodiment and as shown, forming of second inner conductive material 33c does form such material over the trench bases. In one such embodiment, second inner conductive material 33 is formed to run continuously over the trench bases, the trench sidewalls, and semiconductive material 12 between trenches 79 at least in the direction orthogonal to the longitudinal running direction of parallel trenches 79. An example technique for depositing second inner conductive material 33c (e.g., TiN) to be elevationally thicker between the trenches than any that is formed centrally over the trench bases (e.g., low conformality) includes physical vapor deposition.

Figure 16:
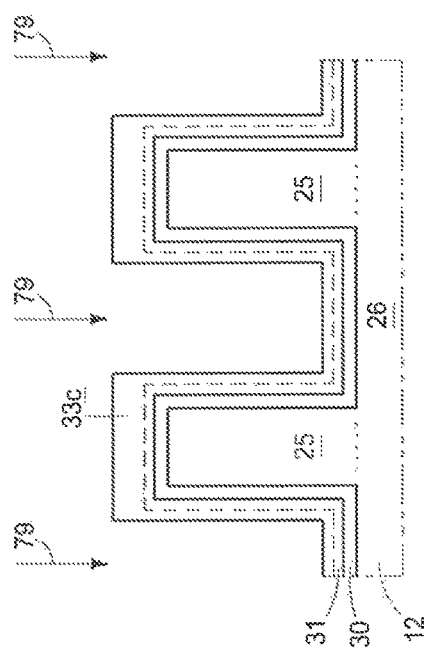
FIG. 16 is a section view taken through line 16-16 in FIG. 15.
Figure 17:
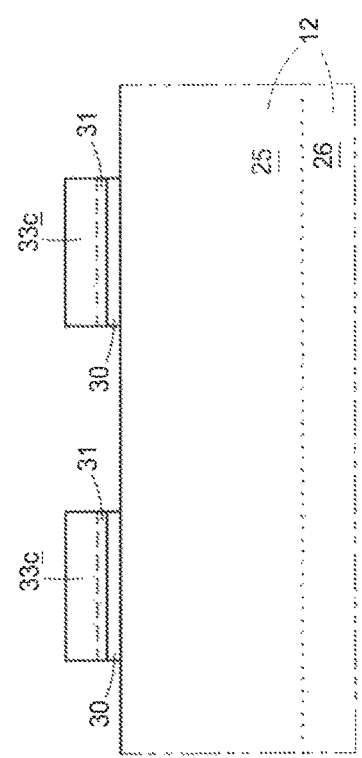
FIG. 17 is a section view taken through line 17-17 in FIG. 15.
Figure 15:
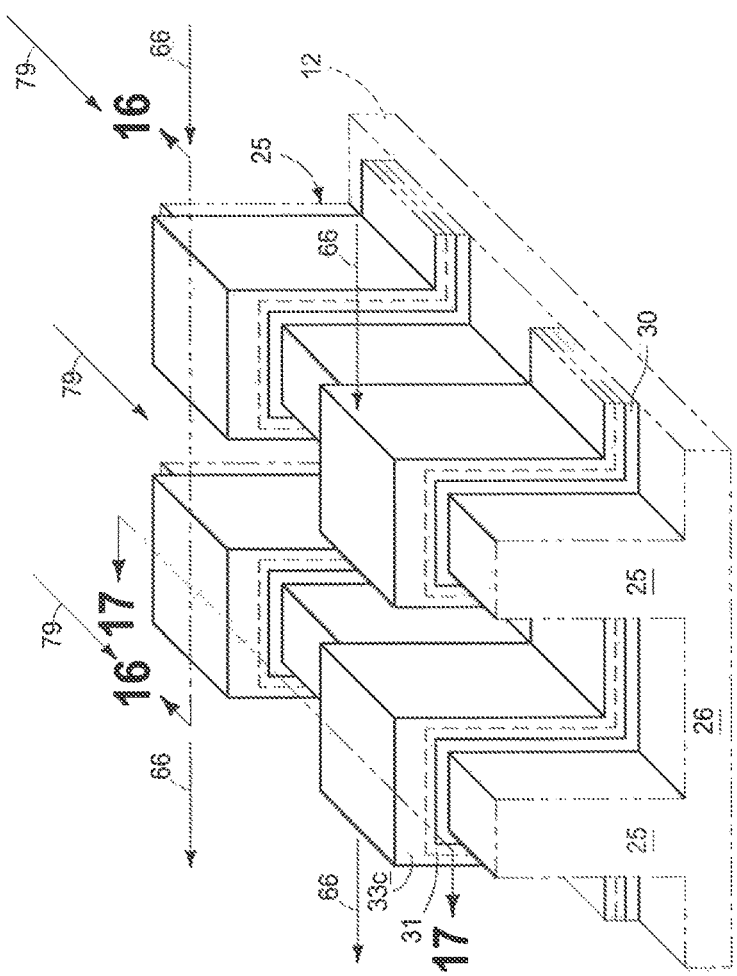
FIG. 15 is a view of the FIG. 12 substrate at a processing step subsequent to that shown by FIG. 12.

Referring to FIGS. 15-17, etching has been conducted at least through second inner conductive material 33c and first inner conductive material 31 to form lines 66 at least of first inner conductive material 31 and that run orthogonal to the longitudinal running direction of parallel trenches 79. Dielectric 30 may also be etched, for example completely there-through as shown.

Figure 18:
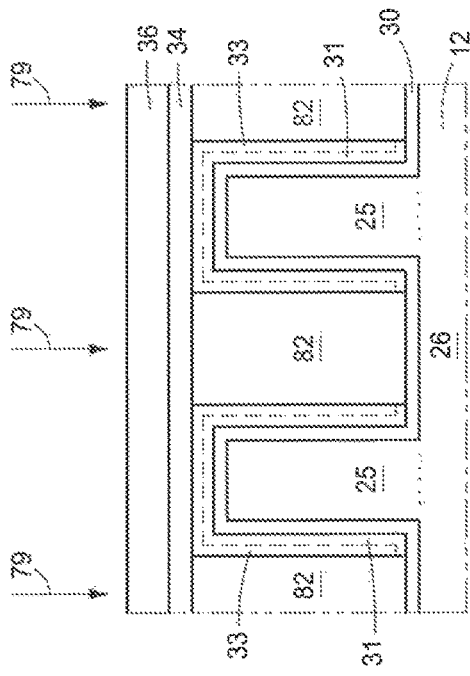
FIG. 18 is a view of the FIG. 16 substrate at a processing step subsequent to that shown by FIG. 16.
Figure 19:
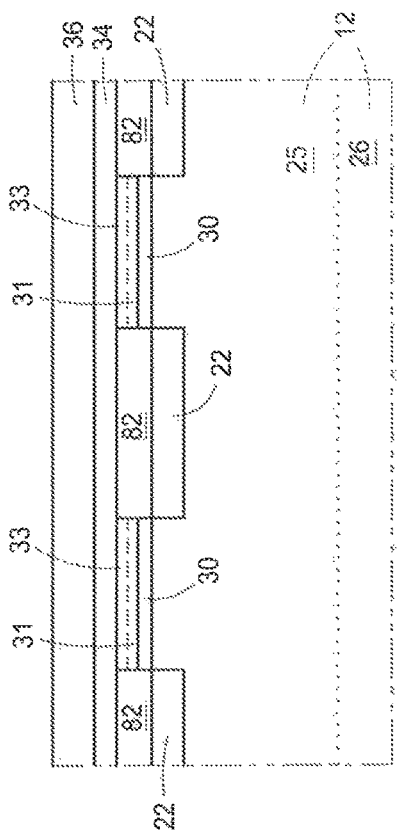
FIG. 19 is a view of the FIG. 17 substrate at a processing step subsequent to that shown by FIG. 17, and corresponding in processing sequence to that of FIG. 18.

Referring to FIGS. 18 and 19, such respectively correspond to section views 16 and 17 at a subsequent processing step. Anisotropic etching has been conducted of both a) first inner conductive material 31 from over the trench bases to isolate first inner conductive material 31 from being continuous over the individual trench bases, and b) second inner conductive material 33c (designated as 33 post-etch) that is elevationally over semiconductive material 12 that is between trenches 79. Such anisotropic etching includes at least one etching step which is common to the etching of both first inner conductive material 31 and second inner conductive material 33c. In one embodiment and as shown, the etching leaves some of second inner conductive material 33 elevationally over first inner conductive material 31 between trenches 79, and in one embodiment leaves some of second inner conductive material 33 laterally along the trench sidewalls. In one embodiment where second inner conductive material 33c also deposits centrally over the trench bases, the common etching step also etches it from over the trench bases to isolate it from being continuous over the individual trench bases, as is shown. Source/drain regions 22 (FIG. 19) may also be formed.

In the above example embodiment, etching is shown as having occurred first with respect to FIGS. 15-17 and then with respect to FIGS. 18 and 19. Alternately, this could be reversed whereby the FIGS. 18 and 19 etching occurs first (e.g., with respect to the FIGS. 12-14 construction) followed by the FIGS. 15-17 etching. Regardless, in one embodiment, the anisotropic etching exemplified by FIGS. 18 and 19 may be conducted in the absence of masking (i.e., in maskless/no mask manner) at least within an entirely of an array region of the transistors being formed.

Figure 20:
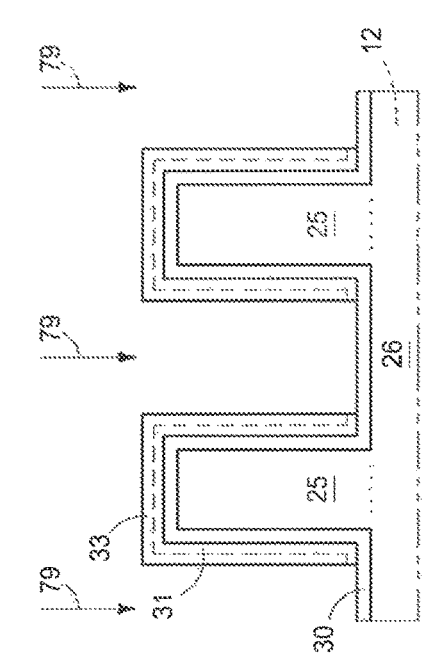
FIG. 20 is a view of the FIG. 8 substrate at a processing step subsequent to that shown by FIG. 18.
Figure 21:
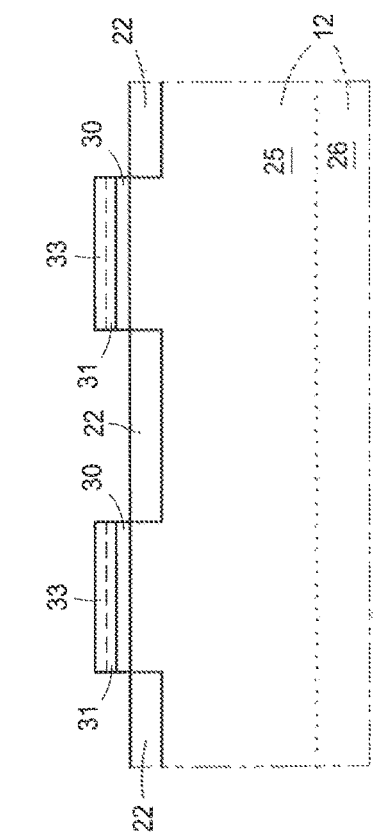
FIG. 21 is a view of the FIG. 19 substrate at a processing step subsequent to that shown by FIG. 19, and corresponding in processing sequence to that of FIG. 20.

Referring to FIGS. 20 and 21, and in one embodiment, dielectric fill material 82 (e.g., silicon dioxide and/or silicon nitride) has been formed within trenches 79 over the trench bases and at least over first inner conductive material 31 that is along the trench sidewalls. Outer ferroelectric material 34 has been formed elevationally over first inner conductive material 31 that is over semiconductive material 12 that is between trenches 79. Additionally, outer conductive material 36 has been formed elevationally over outer ferroelectric material 34. Outer conductive material 36 and outer ferroelectric material 34 may then be patterned, by way of example, to produce either the array construction 65 of FIGS. 4-6 or the array construction 65a of FIGS. 7-9.

Any other attribute(s) or construction(s) as described above may be used.

CONCLUSION in some embodiments, a ferroelectric field effect transistor comprises a semiconductive channel comprising opposing sidewalls and an elevationally outermost top. A source/drain region is at opposite ends of the channel. A gate construction of the transistor comprises inner dielectric extending along the channel top and laterally along the channel sidewalls. Inner conductive material is elevationally and laterally outward of the inner dielectric and extends along the channel top and laterally along the channel sidewalls. Outer ferroelectric material is elevationally outward of the inner conductive material and extends along the channel top. Outer conductive material is elevationally outward of the outer ferroelectric material and extends along the channel.

In some embodiments, a plurality of ferroelectric field effect transistors is arrayed in row lines and column lines. Individual of the ferroelectric field effect transistors comprise a semiconductive channel comprising opposing sidewalls and an elevationally outermost top. A source/drain region is at opposite ends of the channel. A gate construction of the individual transistors comprises inner dielectric extending along the channel top and laterally along the channel sidewalls. Inner conductive material is elevationally and laterally outward of the inner dielectric and extends along the channel top and laterally along; the channel sidewalls. Outer ferroelectric material is elevationally outward of the inner conductive material and extends along the channel top. Outer conductive material is elevationally outward of the outer ferroelectric material and extends along the channel top. At least one of the outer conductive material and the outer ferroelectric material is discontinuous along both of the row lines and the column lines between immediately adjacent transistors.

In some embodiments, a plurality of ferroelectric field effect transistors arrayed in row lines and column lines comprises individual ferroelectric field effect transistors comprise a semiconductive channel comprising sidewalls and an elevationally outermost top. A source/drain region is at opposite ends of the channel. A gate construction of the individual transistors comprises inner dielectric extending along the channel top and laterally along the channel sidewalls. Inner conductive material is elevationally and laterally outward of the inner dielectric and extends along the channel top and laterally along the channel sidewalk. Outer ferroelectric material is elevationally outward of the inner conductive material and extends along the channel top. Outer conductive material is elevationally outward of the outer ferroelectric material and extends along the channel top. The outer conductive material and the outer ferroelectric material are discontinuous between immediately adjacent transistors along one of a) the collective row lines, and b) the collective column lines. The outer conductive material and the ferroelectric material are continuous between immediately adjacent transistors along the other of the collective row lines and the collective column lines.

In some embodiments, an MFMIS transistor has F along a horizontal channel surface and I along a vertical channel surface. In some such embodiments, F is not along any vertical channel surface of the transistor. In some such embodiments, I is along two vertical channel surfaces of the transistor. In some such embodiments, total area of I that is over the channel of the transistor is greater than total area of F that is over the channel of the transistor.

In some embodiments, a method of forming a plurality of ferroelectric field effect transistors comprises forming a plurality of trenches into semiconductive material, the trenches being parallel and longitudinally elongated relative to horizontal. Inner dielectric is formed over sidewalls of the trenches and over semiconductive material that is between the trenches. First inner conductive material is formed over the inner dielectric, bases of the trenches, the trench sidewalk, and the semiconductive material that is between the trenches. The first inner conductive material is continuous within and between the trenches at least in a direction orthogonal to a horizontal longitudinal running direction of the parallel trenches. Second inner conductive material is formed over and electrically couples to the first inner conductive material. The second inner conductive material is formed elevationally thicker over the semiconductive material that is between the trenches than any that is formed elevationally centrally over the trench bases. In at least one common etching step, anisotropically etching is conducted of both: a) the first inner conductive material from over the trench bases to isolate the first inner conductive material from being continuous over the individual trench bases; and b) the second inner conductive material that is elevationally over the semiconductive material that is between the trenches. After the etching, outer ferroelectric material is formed elevationally over the first inner conductive material that is over the semiconductive material that is between the trenches. Outer conductive material is formed elevationally over the outer ferroelectric material. Source/drain regions are formed in the semiconductive material that is between the trenches on opposing sides of the first inner conductive material that overlies the semiconductive material that is between the trenches.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

The invention claimed is:

1. A memory cell comprising:
   a vertically extending semiconductive channel;
   first dielectric wrapped over a top surface and a pair of outer sidewalls of the vertically extending channel;
   first conductive material wrapped over a top surface and a pair of outer sidewalls of the first dielectric;
   ferroelectric material over a top surface of the first conductive material, the ferroelectric material being absent from all outer vertical sidewall surfaces of the first conductive material; and
   second conductive material over a top surface of the ferroelectric material; at least one pair of outer sidewalls of the first conductive material, at least one pair of outer sidewalls of the ferroelectric material, and at least one pair of outer sidewalls of the second conductive material being laterally coincident relative one another.

2. The memory cell of claim 1 wherein all of the outer sidewalls of the first conductive material, the ferroelectric material, and the second conductive material are laterally coincident relative one another.

3. A computer comprising multiple memory cells of claim 1.

4. A system comprising multiple memory cells of claim 1.

5. A memory cell comprising:
   a vertically extending semiconductive channel;
   first dielectric wrapped over a top surface and a pair of outer sidewalls of the vertically extending channel;
   first conductive material wrapped over a top surface and a pair of outer sidewalls of the first dielectric;
   ferroelectric material over a top surface of the first conductive material, the ferroelectric material being absent all outer vertical sidewall surfaces of the first conductive material; and
   second conductive material over a top surface of the ferroelectric material; at least one pair of outer sidewalls of the first conductive material and at least one pair of outer sidewalls of the ferroelectric material being laterally coincident relative one another.

6. A computer comprising multiple memory cells of claim 5.

7. A system comprising multiple memory cells of claim 5.

8. A memory cell comprising:
   a vertically extending semiconductive channel;
   first dielectric wrapped over a top surface and a pair of outer sidewalls of the vertically extending channel;
   first conductive material wrapped over a top surface and a pair of outer sidewalls of the first dielectric;
   ferroelectric material over a top surface of the first conductive material, the ferroelectric material being absent from all outer vertical sidewall surfaces of the first conductive material; and
   second conductive material over a top surface of the ferroelectric material; at least one pair of outer sidewalls of the ferroelectric material and at least one pair of outer sidewalls of the second conductive material being laterally coincident relative one another.

9. A computer comprising multiple memory cells of claim 8.

10. A system comprising multiple memory cells of claim 8.

11. A memory cell comprising:
    a vertically extending semiconductive channel;
    first dielectric wrapped over a top surface and a pair of outer sidewalls of the vertically extending channel;
    first conductive material wrapped over a top surface and a pair of outer sidewalls of the first dielectric;
    ferroelectric material over a top surface of the first conductive material, the ferroelectric material being absent from all outer vertical sidewall surfaces of the first conductive material; and
    second conductive material over a top surface of the ferroelectric material; at least one pair of outer sidewalls of the first conductive material and at least one pair of outer sidewalls of the second conductive material being laterally coincident relative one another.

12. A computer comprising multiple memory cells of claim 11.

13. A system comprising multiple memory cells of claim 11.

* * * * *

UNITED STATES PATENT AND TRADEMARK OFFICE
CERTIFICATE OF CORRECTION

PATENT NO. : 10,727,336 B2
APPLICATION NO. : 16/106626
DATED : July 28, 2020
INVENTOR(S) : Durai Vishak Nirmal Ramaswamy and Kirk D. Prall It is certified that error appears in the above-identified patent and that said Letters Patent is hereby corrected as shown below:

On the Title Page

(57) Abstract, Line 6 – Replace "channel sidewalk." with --channel sidewalls.--

(57) Abstract, Line 9 – Replace "channel sidewalk." with --channel sidewalls.--

In the Specification

Column 4, Line 32 – Replace "channel sidewalk 16, 18" with --channel sidewalls 16, 18--

Column 6, Line 25 – Replace "and sidewalk 46, 50" with --and sidewalls 46, 50--

Column 10, Line 6 – Replace "channel sidewalk." with --channel sidewalls.--

Signed and Sealed this
Twentieth Day of October, 2020

Andrei Iancu
*Director of the United States Patent and Trademark Office*